United States Patent [19]
Stinson

[11] Patent Number: 4,992,704
[45] Date of Patent: Feb. 12, 1991

[54] VARIABLE COLOR LIGHT EMITTING DIODE

[75] Inventor: John W. Stinson, Stanton, Calif.

[73] Assignee: Basic Electronics, Inc., Stanton, Calif.

[21] Appl. No.: 339,221

[22] Filed: Apr. 17, 1989

[51] Int. Cl.⁵ .............................................. H05B 41/36
[52] U.S. Cl. ..................................... 315/312; 315/324; 315/167; 362/800; 313/303
[58] Field of Search ............... 362/800; 313/1, 6, 303; 315/312, 324, 167, 168, 291, 297; 358/59; 357/17; 340/701

[56] References Cited

U.S. PATENT DOCUMENTS 4,367,464  1/1983  Kurahashi et al. ............ 315/324 X
4,420,711 12/1983  Takahashi et al. ............ 315/324 X

FOREIGN PATENT DOCUMENTS 0123884  9/1979  Japan .................................. 357/17

Primary Examiner—Eugene R. Laroche
Assistant Examiner—Ali Neyzari
Attorney, Agent, or Firm—Roger A. Marrs

[57] ABSTRACT

A light emitting diode (LED) or lamp is disclosed herein programmable to emit a variety of colors or hues at the selection of the user having a unitary housing of clear molded solid epoxy supporting three light dies characterized as producing color hues of red, green and blue respectively. A common cathode is supported in the housing and wire leads interconnect the anode of each light die with the common cathode. Control circuits are operably coupled to anode leads and a common cathode lead for selectively energizing the light die anodes so that their respective color outputs visually combine to produce a desired color or hue.

3 Claims, 1 Drawing Sheet

VARIABLE COLOR LIGHT EMITTING DIODE

BACKGROUND OF THE INVENTION

1. Field of the Invention

The present invention relates to the field of illumination utilizing color light emitting diodes (LEDs) and more particularly to a novel unitary lighting device incorporating light dies in a single housing capable of producing a desired color from the combined energization of red, green and blue anodes of three different light dies which are adjusted via control circuits so that the intensity of the respective color emissions from each of the diodes is combined to produce the desired lighting device emitting color.

2. Brief Description of the Prior Art

In the past, it has been the conventional practice to produce and utilize light emitting diodes (LED) which have been limited in the number of colors producible. Difficulties and problems were encountered in creating selective or variable colors from such diodes which stem largely from the fact that technology could not produce an LED which would emit a blue light. Without such technology, only the colors of red, green, amber, orange and yellow were able to be produced.

With the advancement of technological concepts, blue LEDs are available so that the color blue can be produced. Therefore, by introducing a new LED concept which incorporates the three primary colored LEDs, i.e., red, green and blue, any color including the color white can be produced from the combination. However, at the present time, a single diode is not available which can produce a variety of colors from a single energization. The red, green and blue diodes used conventionally are separate and are independent from one another in physical as well as electrical separation.

Therefore, a long standing need has existed to provide a single unitary lighting device having at least three light dies having the color anodes incorporated into a single unit with a common cathode and which further includes control circuits for selectively energizing the anodes of the light dies to produce a desired color result.

SUMMARY OF THE INVENTION

Accordingly, the above problems and difficulties are obviated by the present invention which provides a novel single lighting device or unitary combined LED capable of producing any color. The single LED includes a unitary housing of transparent or translucent material which supports a red, a green and a blue light die in fixed spaced relationship with respect to each other. The cathodes of each light die are coupled to a common cathode lead via a mounting pad or plate carried in a reflector cup integrally formed on the end of a cathode lead. Separate lead wires connect each anode to a separate and spaced-apart anode lead. The housing supports not only the light dies but the separate anode leads and common cathode lead so that a unitary structure is produced enclosing the respective components.

Control circuits are operably connected to the light die anodes and common cathode for energizing the light dies selectively so as to produce a variable light emitting intensity from each light die corresponding to its color or hue.

Therefore, it is among the primary objects of the present invention to provide a novel lighting device or LED combination in a single housing or unit capable of emitting a variety of colors or hues depending upon the energization of red, green and blue light dies supported within the single housing.

Another object of the present invention is to provide a single light emitting diode structure incorporating light dies emitting the three primary colors and which include circuit means for varying the color intensities of each light die anode or lamp separately so that any color, including the color white, can be produced from the single lighting device or lamp.

Yet another object of the present invention is to provide a single lamp for producing a variety of colors and hues which at least includes three light dies supported in a single housing capable of producing the three primary colors in varying intensities so that their combined light emits a desired color or hue.

A further object of the invention resides in controlling the intensity of at least three light dies producing the three primary colors so that their combined visual emission provides a desired color or hue of the light spectrum.

BRIEF DESCRIPTION OF THE DRAWINGS

The features of the present invention which are believed to be novel are set forth with particularity in the appended claims. The present invention, both as to its organization and manner of operation, together with further objects and advantages thereof, may best be understood with reference to the following description, taken in connection with the accompanying drawings in which:

DESCRIPTION OF THE PREFERRED EMBODIMENT

Figure 1:
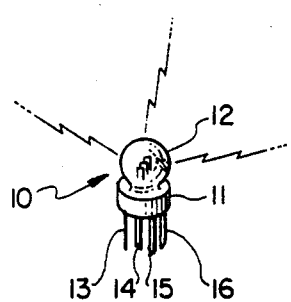
FIG. 1 is a perspective view showing the novel light emitting device or combined diode of the present invention incorporating multiple color light dies in a single housing.

Referring now in detail to FIG. 1, the novel light emitting diode lamp of the present invention is illustrated in the general direction of arrow 10 which includes a single housing broadly identified by numeral 11 which is composed of a translucent or transparent material, such as clear molded solid epoxy. The light emitting portion of the housing is indicated by numeral 12 and since it is transparent, the anode and cathode components or elements of the light dies are illustrated therein. These elements extend exteriorly of the housing so that pin connection or leads may be connected with additional circuitry for controlling energization of the respective light dies. For example, numeral 13 represents a common cathode lead while numerals 14, 15 and 16 are anode leads extending into the housing for coupling with light die anodes.

Each of the respective light dies is associated with a different primary color, such as red, green and blue. The control circuit attached to the leads may vary the color intensity of each of the light dies so that the overall and combined light radiating from the housing may be a predetermined color or hue. Therefore, any color, including the color white, can be produced from a single lamp 10.

Figure 2:
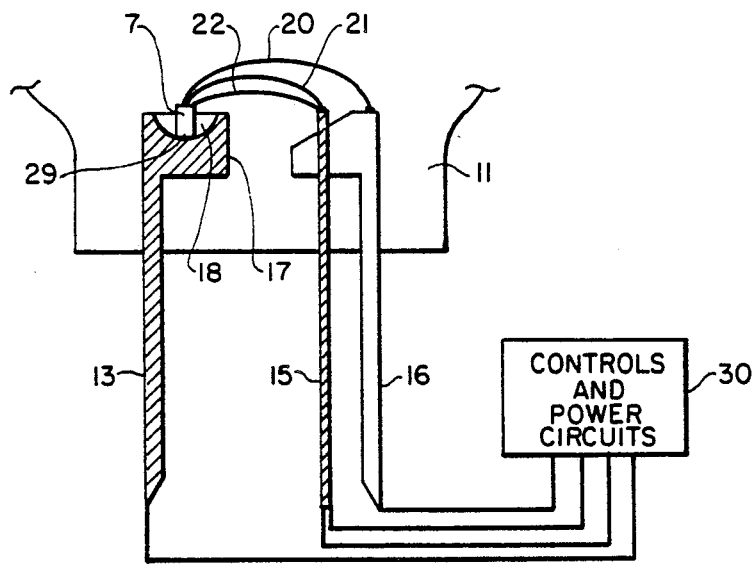
FIG. 2 is an enlarged section view of the lighting device shown in FIG. 1 illustrating at least three light dies having their cathodes connected in common to a single cathode lead within a single supporting housing.
Figure 3:
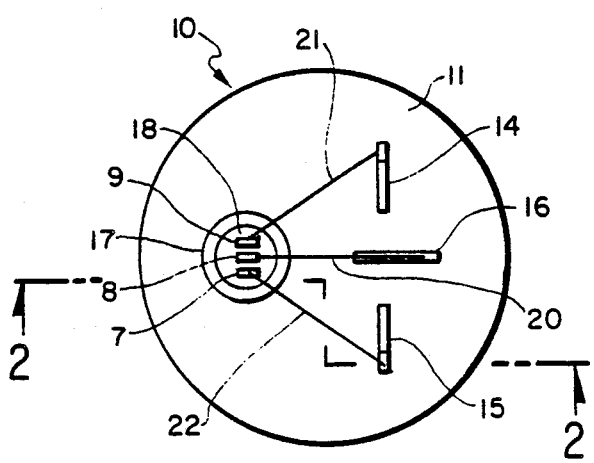
FIG. 3 is a top plan view of the lighting device or lamp shown in FIG. 2.
Figure 4:
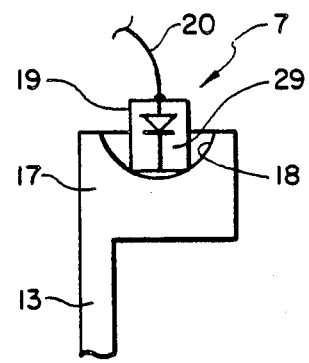
FIG. 4 is a view similar to the view of FIG. 2 illustrating the mounting of the light dies and the control circuit therefor.

Referring now in detail to FIGS. 2, 3 and 4, it can be seen that light dies 7, 8 and 9 are embedded within the housing 11 so as to provide a single unitary construction. The common cathode lead 13 is provided with an enlarged top portion 17 which is formed with a reflector cup 18 into which one end of leads 20, 21 and 22 are attached while their opposite ends are attached to the anodes of the light dies.

As shown in FIGS. 3 and 4, each light die 7, 8 and 9 includes an anode 19 and a cathode 29 that is soldered on and within the cup 18. Therefore, in this manner, it can be seen that the cathode lead 13 is coupled in common with the cathodes of a plurality of light die cathodes. With respect to composition, one light die, such as 7 representing red, may be composed of a composition consisting of deep red AlGaAs (Aluminum Gallium Arsenide). Light die 8 may represent green and be composed of Gallium Phosphide on Gallium Phosphide (GaP). The remaining light die 9 is representative of blue and is composed of Silicon Carbide. Preferably, the connecting wires 20-22 inclusive are approximately 1 mil. in thickness and each is composed of gold wire. The cathode lead including reflective cup and anode leads are soldered steel, silver plated or the like.

Referring now in detail to FIGS. 3 and 4, it can be seen that the reflector cup 18 includes three mounting solder points on which the respective light dies 7, 8 and 9 are attached so that the cathode of each light die is secured in common to the cathode lead 13. The anode 19 of each light die is connected to a separate anode lead 14, 15 and 16 by the lead wires 20, 21 and 22.

In the present lamp, the three light dies comprised of one red, one green and one blue represent the primary colors. The primary colors are colors that cannot be reproduced with any other color or combination of colors, but, at the same time, can either by themselves or in combination with one another produce any color in the visual light spectrum including the color white. In the present invention, an operating circuit including controls and power supply 30 are connected to the cathode and anode leads provide the proper biasing of the individual lamp or light dies 7, 8 and 9 in order to achieve the predetermined color or hue.

Therefore, by use of the present invention, only a single lighting device or lamp is required to produce all colors in the visible light spectrum, including the color white. The light radiation or output is the brightest available employing high efficient and superbright lamp or light dies.

While particular embodiments of the present invention have been shown and described, it will be obvious to those skilled in the art that changes and modifications may be made without departing from this invention in its broader aspects and, therefore, the aim in the appended claims is to cover all such changes and modifications as fall within the true spirit and scope of this invention.

What is claimed is:

1. A light emitting device radiating a variety of colors and hues comprising the combination of:
    at least three separate and individual light dies wherein each light die is characterized as emitting a color chosen from red, green and blue;
    each of said light dies having an anode and a cathode;
    means for electrically and mechanically joining said light die cathodes in common for exterior connection;
    means coupled to said light die anodes for separate and individual exterior connection;
    a transparent housing enclosing and supporting said light dies and said connection means in a single unitary structure;
    circuit means operably connected to said anodes and said cathode for selectively energizing said anodes individually at a desired intensity level;
    said common cathode means includes an elongated lead having an enlarged portion provided with a recessed cup-like reflector operably supporting said light die cathodes therein;
    said anode connector means includes at least three elongated leads arranged in fixed spaced relationship with respect to each other and with respect to said common cathode lead;
    said anode connector means further including a connecting wire having its opposite ends secured between a selected one of said anode leads and a selected one of said light die anodes; and
    one of said light die anodes being composed of AlGaAs, another light die anode is composed of GaP, and another light die anode is composed of Silicon Carbide.

2. The invention as defined in claim 1, wherein:
    said housing is composed of a clear molded solid epoxy having a portion of said common cathode lead and said anode leads projecting outward exteriorly of said housing for coupling with said circuit means.

3. A single unitized light emitting diode lamp for radiating any color or hue comprising:
    three solid state light dies having cathodes and anodes capable of producing red, green and blue colors respectively;
    a common cathode lead operably coupled in common to all said solid state light die cathodes;
    separate anode leads individually connected to each of said solid state light die anodes;
    circuit means coupled to anode leads and said common cathode lead selectively operably to vary the intensity of output for each of said solid state light dies so as to effect a combining of light die output to produce a composite color radiation;
    said common cathode means includes an elongated lead having an elongated portion provided with recessed cup-like reflector operably supporting said light die cathodes therein;
    said anode connector means includes at least three elongated leads arranged in fixed spaced relationship with respect to each other and with respect to said common cathode lead; and
    said anode connector means further including a connecting wire having its opposite ends secured between a selected one of said anode leads and a selected one of said light die anodes;
    a translucent housing enclosing and supporting said light dies including said common cathode lead and said anode leads and said interconnecting wires in a single unitary lamp package;
    one of said light die anodes being composed of AlGaAs, another light die anode is composed of GaP, and another light die anode is composed of Silicon Carbide; and
    said housing is composed of a translucent molded solid epoxy having a portion of said common cathode lead and said anode leads projecting outward exteriorly of said housing for coupling with said circuit means.

* * * * *